United States Patent
He et al.

(10) Patent No.: US 9,601,386 B1
(45) Date of Patent: Mar. 21, 2017

(54) FIN ISOLATION ON A BULK WAFER

(71) Applicant: INTERNATIONAL BUSINESS MACHINES CORPORATION, Armonk, NY (US)

(72) Inventors: Hong He, Schenectady, NY (US); Juntao Li, Cohoes, NY (US); Junli Wang, Slingerlands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/851,838

(22) Filed: Sep. 11, 2015

(51) Int. Cl.
  *H01L 21/8238* (2006.01)
  *H01L 21/306* (2006.01)
  *H01L 21/02* (2006.01)

(52) U.S. Cl.
  CPC ........ *H01L 21/823821* (2013.01); *H01L 21/02532* (2013.01); *H01L 21/02592* (2013.01); *H01L 21/02667* (2013.01); *H01L 21/30604* (2013.01); *H01L 21/823878* (2013.01)

(58) Field of Classification Search
  None
  See application file for complete search history.

(56) References Cited

U.S. PATENT DOCUMENTS

| | | | |
|---|---|---|---|
| 7,101,763 B1 | 9/2006 | Anderson et al. | |
| 8,035,199 B2 | 10/2011 | Izumida et al. | |
| 8,048,723 B2 | 11/2011 | Chang et al. | |
| 8,227,304 B2 * | 7/2012 | Iyer | H01L 21/02381 257/347 |
| 8,785,284 B1 | 7/2014 | Bergendahl et al. | |
| 8,951,850 B1 | 2/2015 | He et al. | |
| 8,975,125 B2 | 3/2015 | Adam et al. | |
| 9,029,913 B2 | 5/2015 | Utomo et al. | |
| 2007/0221956 A1 * | 9/2007 | Inaba | H01L 21/823807 257/197 |
| 2013/0316513 A1 | 11/2013 | Basker et al. | |
| 2014/0264591 A1 | 9/2014 | Wang et al. | |
| 2015/0021691 A1 | 1/2015 | Akarvardar et al. | |
| 2016/0247677 A1 * | 8/2016 | He | H01L 21/02488 |

* cited by examiner

*Primary Examiner* — David E Graybill
(74) *Attorney, Agent, or Firm* — Tutunjian & Bitetto, P.C.; Vazken Alexanian

(57) ABSTRACT

A method for forming a semiconductor device includes etching first fins into a bulk semiconductor substrate and exposing a portion of the first fins through a first dielectric layer formed over the first fins. A first film is deposited over the first fins in a region for n-type devices. and a second film is deposited over the first fins in a region for p-type devices. The first film and the second film are etched to form second fins in the regions for n-type devices and for the region for p-type devices. The second fins are protected. The first fins are removed from the first dielectric layer to form an isolation layer separating the second fins from the substrate.

20 Claims, 9 Drawing Sheets

US 9,601,386 B1

FIN ISOLATION ON A BULK WAFER

BACKGROUND

Technical Field

The present invention relates to semiconductor processing, and more particularly to methods for forming Si and SiGe fins on a dielectric layer using a bulk wafer.

Description of the Related Art

Many fin field effect transistor (finFET) processes begin by using thick silicon-on-insulator (SOI) substrates. The processes typically protect N-type field effect transistor (NFET) devices with a SiN hard mask, and fins in an area for P-type field effect transistor (PFET) devices are etched. A high quality undoped SiGe epitaxy is performed to selectively grow SiGe on the etched fins. After the hard mask is stripped from the NFET area, fin patterning and reactive ion etching (RIE) are performed. In many processes, Ge diffuses into NFET areas, which degrades performance of the NFETs. Using the SOI substrate can result in leakage to a base substrate. In addition, before SiGe growth, corners of the fins are susceptible to etching before the SiGe is grown.

SUMMARY

A method for forming a semiconductor device includes etching first fins into a bulk semiconductor substrate and exposing a portion of the first fins through a first dielectric layer formed over the first fins. A first film is deposited over the first fins in a region for n-type devices, and a second film is deposited over the first fins in a region for p-type devices. The first film and the second film are etched to form second fins in the regions for n-type devices and for the region for p-type devices. The second fins are protected. The first fins are removed from the first dielectric layer to form an isolation layer separating the second fins from the substrate.

Another method for forming a semiconductor device includes etching first fins into a bulk semiconductor substrate, the first fins including Si; exposing a portion of the first fins through a first dielectric layer formed over the first fins; depositing and thermally mixing a SiGe film over the first fins in a region for p-type devices; depositing a Si film over the first fins in a region for n-type devices after the thermal mixing to prevent Ge diffusion into the Si film; etching the Si film and the SiGe film to form second fins in the regions for n-type devices and p-type devices; protecting the second fins; and removing the first fins from the first dielectric layer to form an isolation layer separating the second fins from the substrate.

Yet another method for forming a semiconductor device includes etching first fins into a bulk semiconductor substrate, the first fins including Si; exposing a portion of the first fins through a first dielectric layer formed over the first fins; depositing and thermally mixing a SiGe film over the first fins in a region for p-type devices; depositing a Si film over the first fins in a region for n-type devices after the thermal mixing to prevent Ge diffusion into the Si film; planarizing the Si and SiGe films; patterning the Si film and the SiGe film to form second fins in the regions for n-type and p-type devices wherein the second fins are formed over dielectric material of the first dielectric layer and are staggered from the first fins to prevent vertical alignment; protecting the second fins using a hardmask and spacers to encapsulate the second fins; removing the first fins from the first dielectric layer; and restoring material in the first dielectric layer to form an isolation layer separating the second fins from the substrate.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
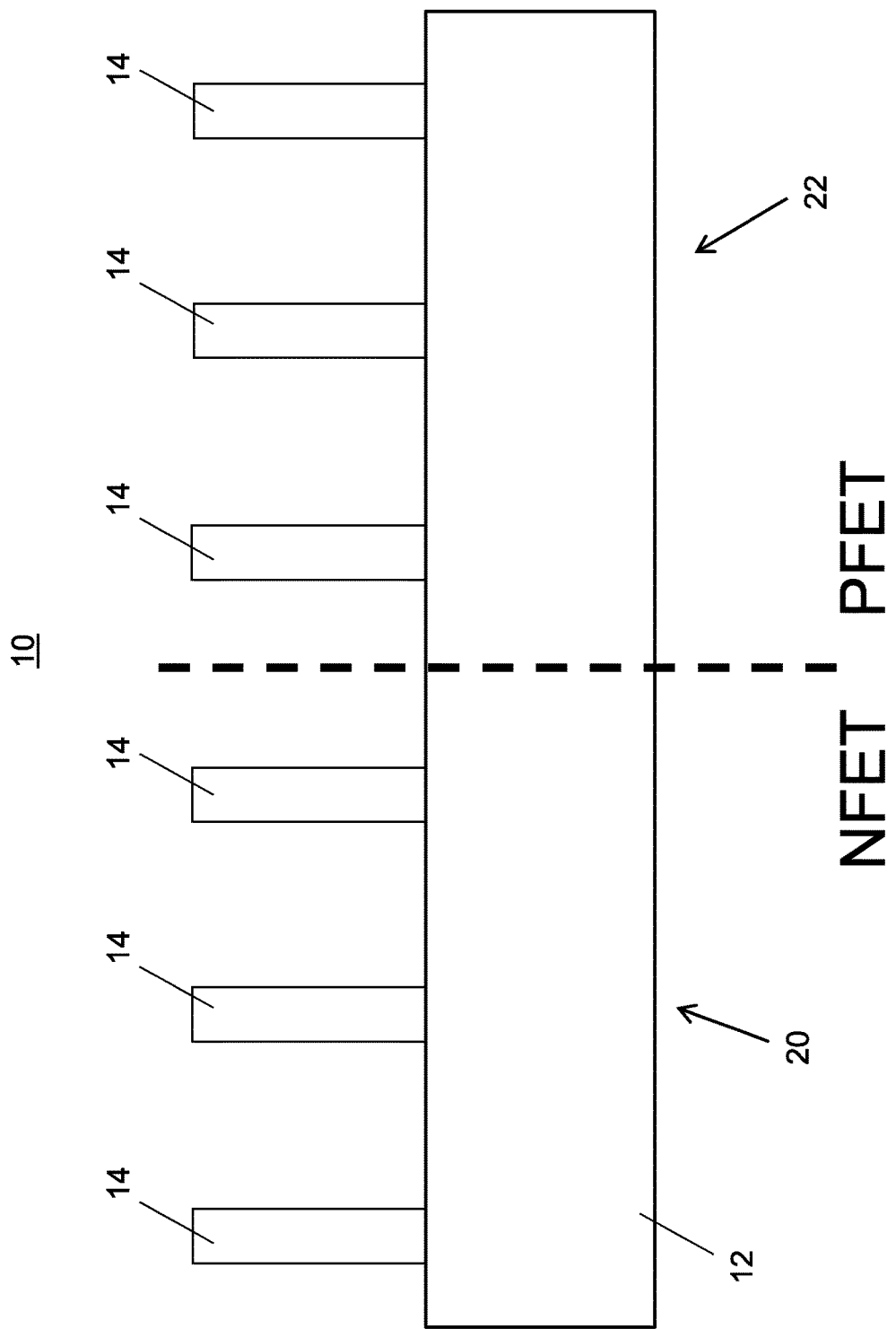
FIG. 1 is a cross-sectional view of a semiconductor device showing fins etched into a bulk substrate in accordance with the present principles.

In accordance with the present principles, complementary metal oxide semiconductor (CMOS) field-effect transistor formation methods are disclosed. In useful embodiments, transistor devices are formed that include fins in silicon with NFET channels and fins in SiGe with PFET channels. The present principles begin with a bulk substrate; however, final transistors will be isolated by a dielectric layer (e.g., an oxide layer), which is similar to silicon-on-insulator (SOI) substrates.

The present principles provide advantages and benefits; some of which include the following. A SiGe channel provides high channel mobility for PFET devices. This improves the PFET device performance. The fins are isolated from the substrate (e.g., bulk silicon) by a dielectric material (e.g., silicon oxide ($SiO_2$)). This addresses source to drain leakage, which can occur with bulk substrates. Beginning the process from a bulk substrate provides wafer commonality across the entire device.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiC or SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is shown in cross-section. The device 10 includes a bulk silicon (Si) substrate 12, preferably monocrystalline Si although a polycrystalline Si substrate may be employed. The present principles may be applied to other bulk substrate materials as well.

The bulk substrate 12 is patterned and etched to form fins 14 therein. The fin patterning process may include a direct lithographic patterning process or a spacer imaging transfer (SIT) patterning process to etch portions of the substrate 12. A reactive ion etch (RIE) process is employed to etch through the substrate 12 to form fins 14 to a certain depth into the substrate 12. The device 10 is divided into n-type field effect transistor (NFET) regions 20 and p-type field effect transistor (PFET) regions 22. The regions 20 and 22 will be processed differently as will be described.

Figure 2:
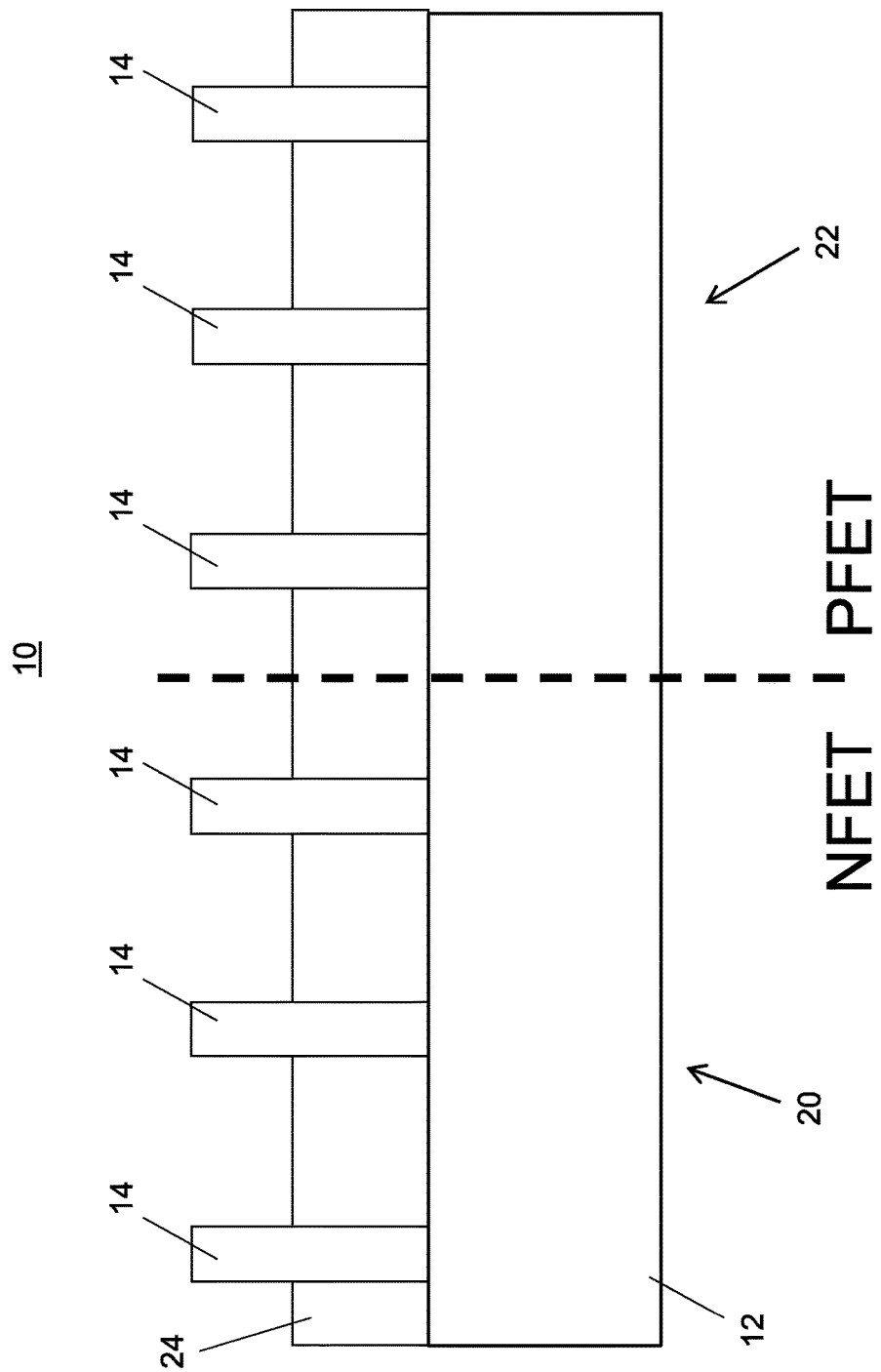
FIG. 2 is a cross-sectional view of the semiconductor device of FIG. 1 showing a dielectric layer formed and recessed to expose top portions of the fins in accordance with the present principles.

Referring to FIG. 2, a dielectric layer 24 is deposited. The dielectric layer 24 may include an oxide and, more specifically, a flowable oxide or a high-aspect-ratio process (HARP) oxide film. The dielectric layer 24 may be annealed to densify the layer 24. A selective etch process may be employed to recess the dielectric layer 24 to expose/reveal the fins 14. The etch process may include a dry or wet etch that selectively removes the dielectric layer 14 (e.g., oxide) with respect to the fins 14 (e.g., silicon).

Figure 3:
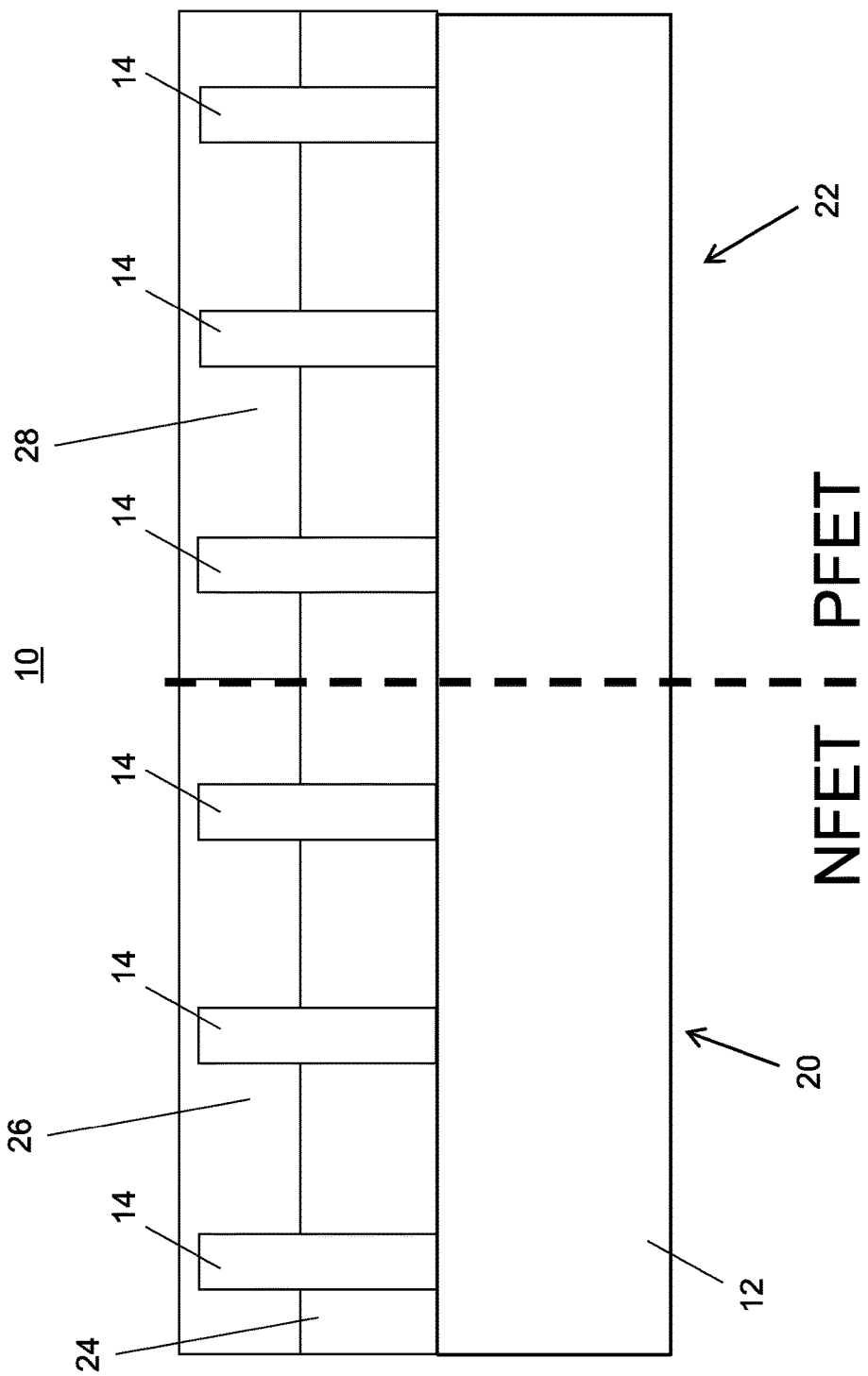
FIG. 3 is a cross-sectional view of the semiconductor device of FIG. 2 showing different semiconductor films formed in an NFET region and a PFET region using the top portions of the fins as a seed layer in accordance with the present principles.

Referring to FIG. 3, films 26 and 28 are formed on the dielectric layer 24. The film 26 is formed in the NFET region 20, and the film 28 is formed in the PFET region 22. The films 26 and 28 may be formed one at a time by blocking off each region 20, 22 where the film is not to be formed. Blocking off the region may include forming a dielectric material or resist (lithographic blocking) (not shown) to prevent deposition or growth in one of the NFET region 20 or the PFET region 22 while the other of the NFET region 20 or the PFET region 22 has its film 26 or 28 formed thereon. The film 26 may include a silicon film, and film 28 may include a SiGe film. The thermal mixing process may include an anneal to diffuse Ge uniformly in the Si to form film 28. In one embodiment, the thermal mixing process includes a thermal condensation process. The thermal condensation process diffuses Ge into Si at between about 900 degrees C. to about 1100 degrees C. for 2-10 seconds. The heat may be applied in one or more cycles by repeating this process in, e.g., a $N_2$ ambient.

In a particularly useful embodiment, SiGe deposition of film 28 is performed first, followed by thermal mixing in the PFET region 22. Then, Si deposition of film 26 occurs in the NFET region 20 to prevent Ge lateral diffusion.

The films 26, 28 may be formed using an epitaxial growth process, such as e.g., molecular beam epitaxy (MBE) or metal-organic chemical vapor deposition (MOCVD). The epitaxial growth process may employ the fins 14 as seeds for the epitaxial growth. In another embodiment, the films 26, 28 may be formed by other processes, e.g., chemical vapor deposition (CVD), etc. While the films 26, 28 may include a crystalline structure, in one embodiment, the films 26, 28 may have an amorphous structure.

After deposition of the films 26, 28, a planarizing process is performed to planarize the films 26, 28. The planarizing process may include, e.g., a chemical mechanical polish (CMP).

Figure 4:
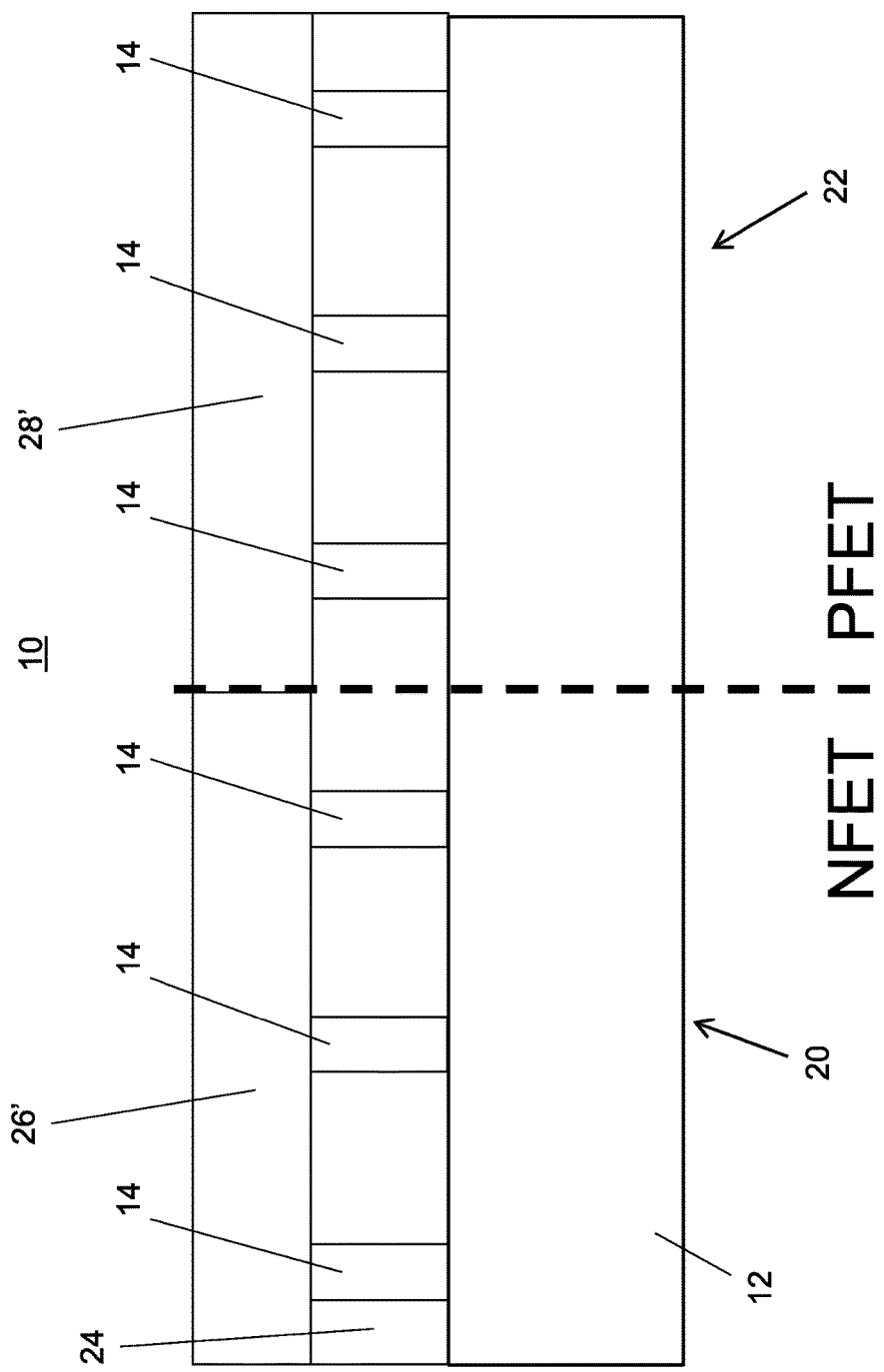
FIG. 4 is a cross-sectional view of the semiconductor device of FIG. 3 showing different semiconductor films formed in an NFET region and a PFET region after thermal mixing and recrystallization in accordance with the present principles.

Referring to FIG. 4, a solid phase epitaxial recrystallization process may be performed to recrystallize the films 26 and 28 to form recrystallized films 26' and 28'. A solid phase epitaxial recrystallization may include applying 400-800 degrees C. in a furnace for several hours (e.g., 2-4 hours) in, e.g., an $N_2$ ambient.

In one embodiment, if the films 26 and 28 are formed from crystalline Si, then a thermal mixing process may be employed to form a SiGe film 28. This may include forming a Ge layer over the film 28 and annealing to drive in Ge to form SiGe for film 28. Recrystallization (e.g., solid phase recrystallization) is then performed to repair damage or crystallize amorphous phases for the films 26, 28.

In another embodiment, Si and SiGe films 26 and 28 are formed separately as amorphous films and recrystallization may be performed by known methods to recrystallize the films 26, 28 to crystallized films 26', 28'. The recrystallized films 26' and 28' provide a monocrystalline structure to form device channels for fin field effect transistors (finFETs) to be formed in later steps. The recrystallized films 26' and 28' may rely on the monocrystalline structure of the underlying fins 14 to provide seed crystals for recrystallization.

It should be understood that a barrier may be employed between the NFET region 20 and the PFET region 22 to prevent Ge diffusion into the Si film 26' of the NFET region 20.

Figure 5:
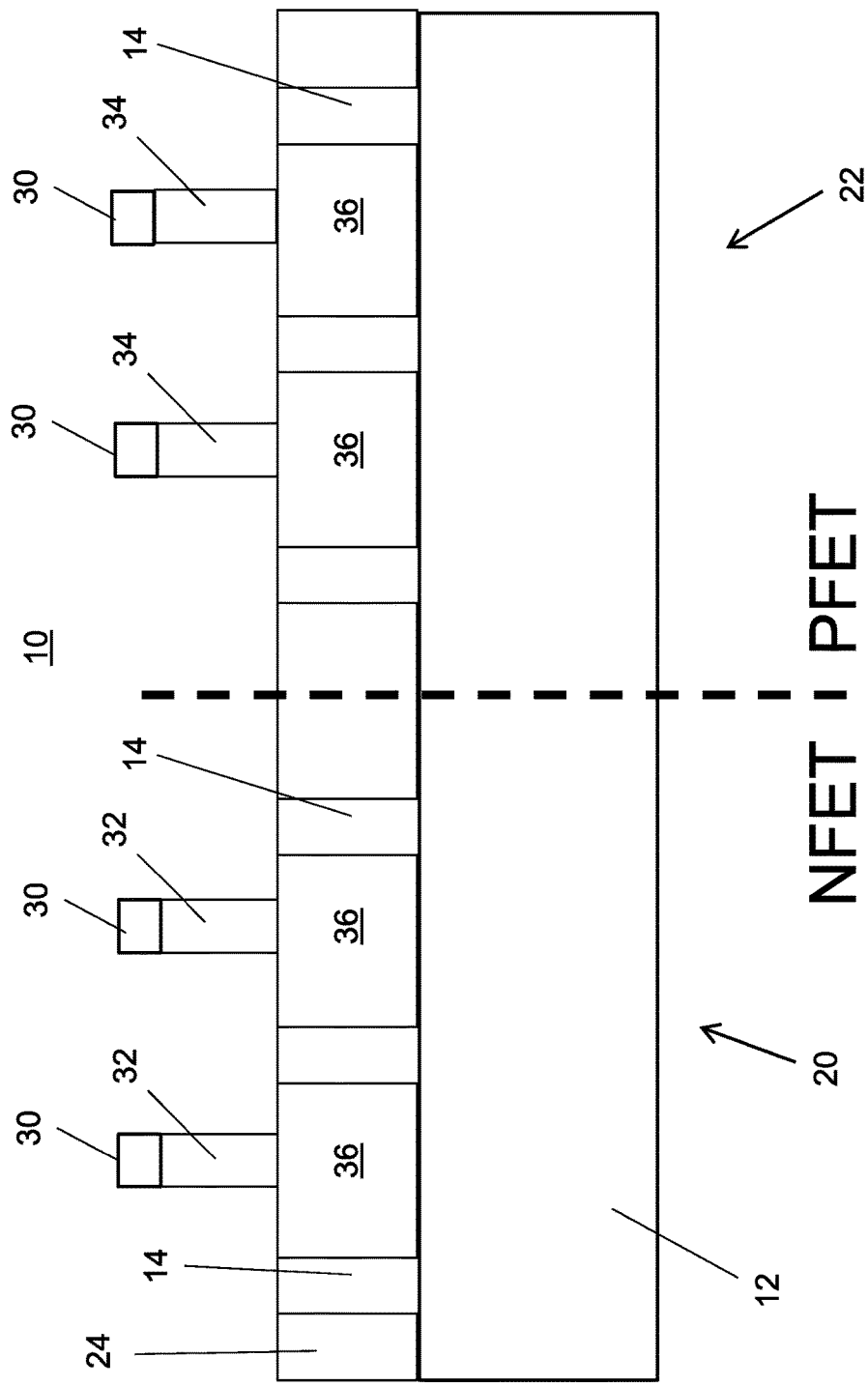
FIG. 5 is a cross-sectional view of the semiconductor device of FIG. 4 showing second fins formed on the dielectric layer and vertically staggered from the first fins in accordance with the present principles.

Referring to FIG. 5, the films 26' and 28' are patterned and etched to form fins 32 and 34, respectively. The fin patterning process may include a direct lithographic patterning process or a spacer imaging transfer (SIT) patterning process to etch portions of the films 26' and 28'. In one embodiment, a lithography process is employed to form and pattern a hard mask 30. The hardmask 30 may include a resist material but preferably includes a nitride material (e.g., SiN). Then, a RIE process is employed to etch through the film 26' to form NFET fins 32 and through the film 28' to form PFET fins 34. The patterning of fins 32 and 34 includes providing the fins 32, 34 on portions 36 of the dielectric layer 24 (and not on fins 14). These portions 36 will function as a shallow trench isolation region (STI) between the fins 32, 34 and the substrate 12.

Figure 6:
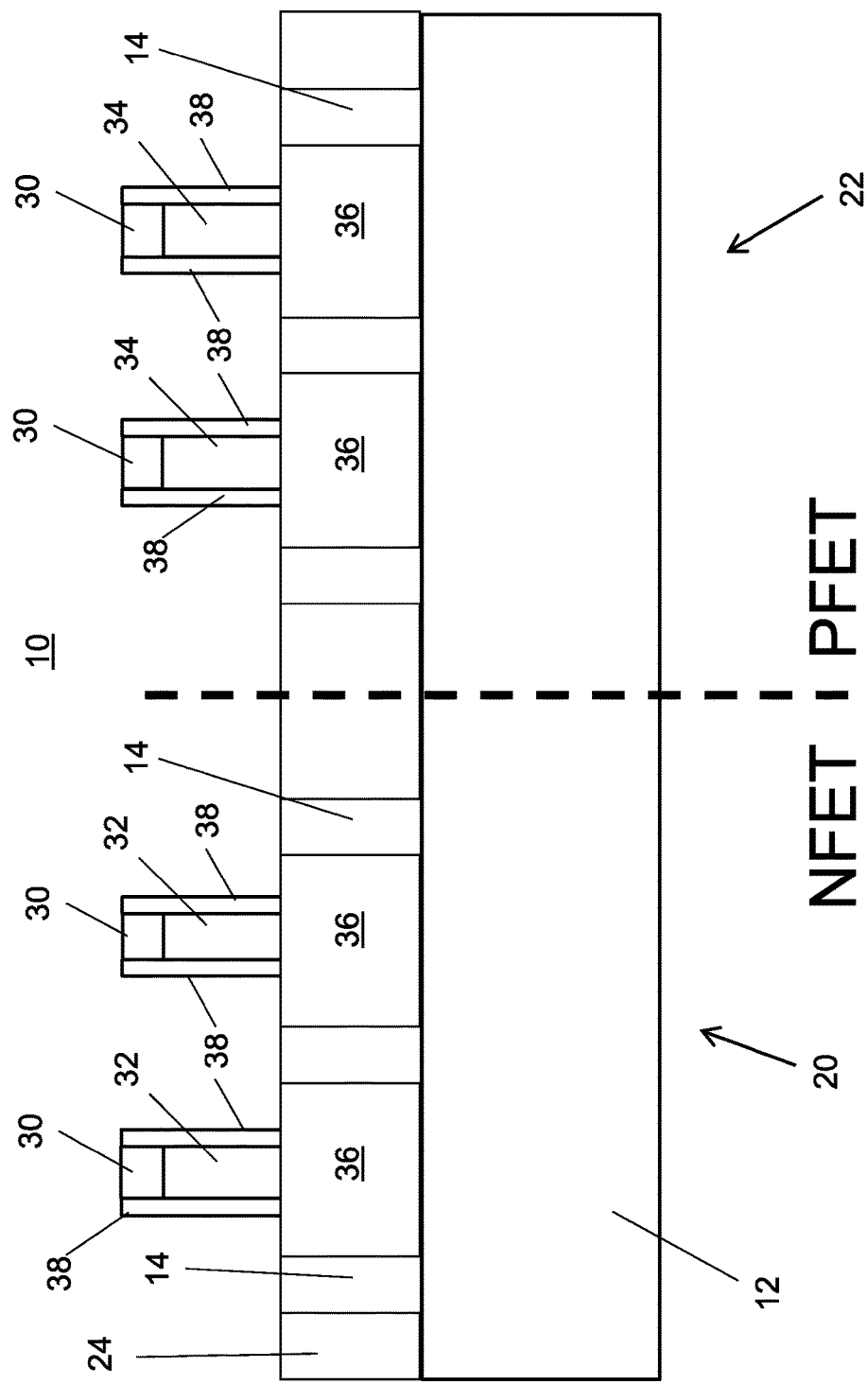
FIG. 6 is a cross-sectional view of the semiconductor device of FIG. 5 showing second fins protected by a hardmask and sidewall spacers in accordance with the present principles.

Referring to FIG. 6, a spacer layer is formed over the hardmask 30 and fins 32, 34. The spacer layer may include a silicon nitride (SiN) deposition. The spacer layer is then removed from horizontal surfaces by employing a RIE to form spacers 38. The RIE exposes top portions of fins 14 within dielectric layer 24.

Figure 7:
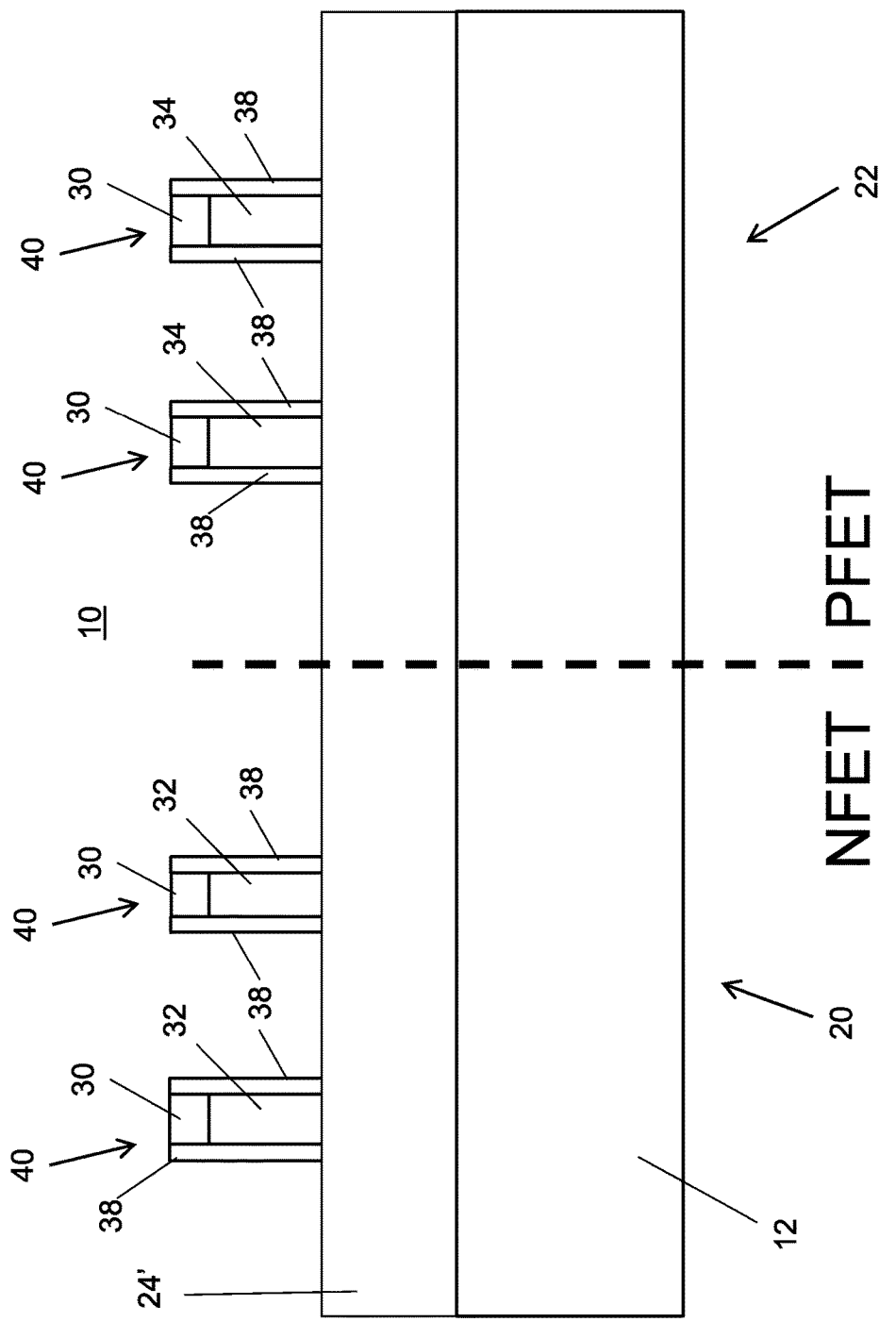
FIG. 7 is a cross-sectional view of the semiconductor device of FIG. 6 showing the first fins processed and the dielectric layer restored in accordance with the present principles.

Referring to FIG. 7, in one embodiment, the fins 14 are selectively removed from the dielectric layer 24 by a selective etch process, e.g., a dry etch. The etch process removes the fins 14 selective to the material of the dielectric layer 24 and the materials of the spacers 38. For example, the fins 14, which may include, e.g., Si, and are removed selective to the dielectric layer 24, e.g., silicon oxide, and the spacers 38 (and hardmask 30), e.g., silicon nitride. The hardmask 30 and the spacers 38 protect the fins 32, 34 during the selective etch.

Once the fins 14 have been removed, a fill process is performed to fill in the trenches left by the removal of fins 14. The fill may include a dielectric material, such as, e.g., an oxide. The dielectric material may be the same material employed in the rest of layer 24. The dielectric material may be annealed to densify the material. The dielectric material is deposited over the tops and sides of fin structures 40 to fill in the trenches. The dielectric material is then planarized down to the hardmask 30, e.g., using a CMP process. Then, a selective etch is performed to recess the dielectric material to form dielectric layer 24'. The recess reveals and exposes the structures 40. The etch process may include a dry or wet etch to selectively recess the dielectric layer 24' (e.g., oxide) to expose the fin structures 40.

In an alternate embodiment, an oxidation process may be performed to convert the fins 14 to dielectric/STI 24. This alternative approach is best performed when the fins 32, 34 are protected by the hardmask 30 and liners 38.

Figure 8:
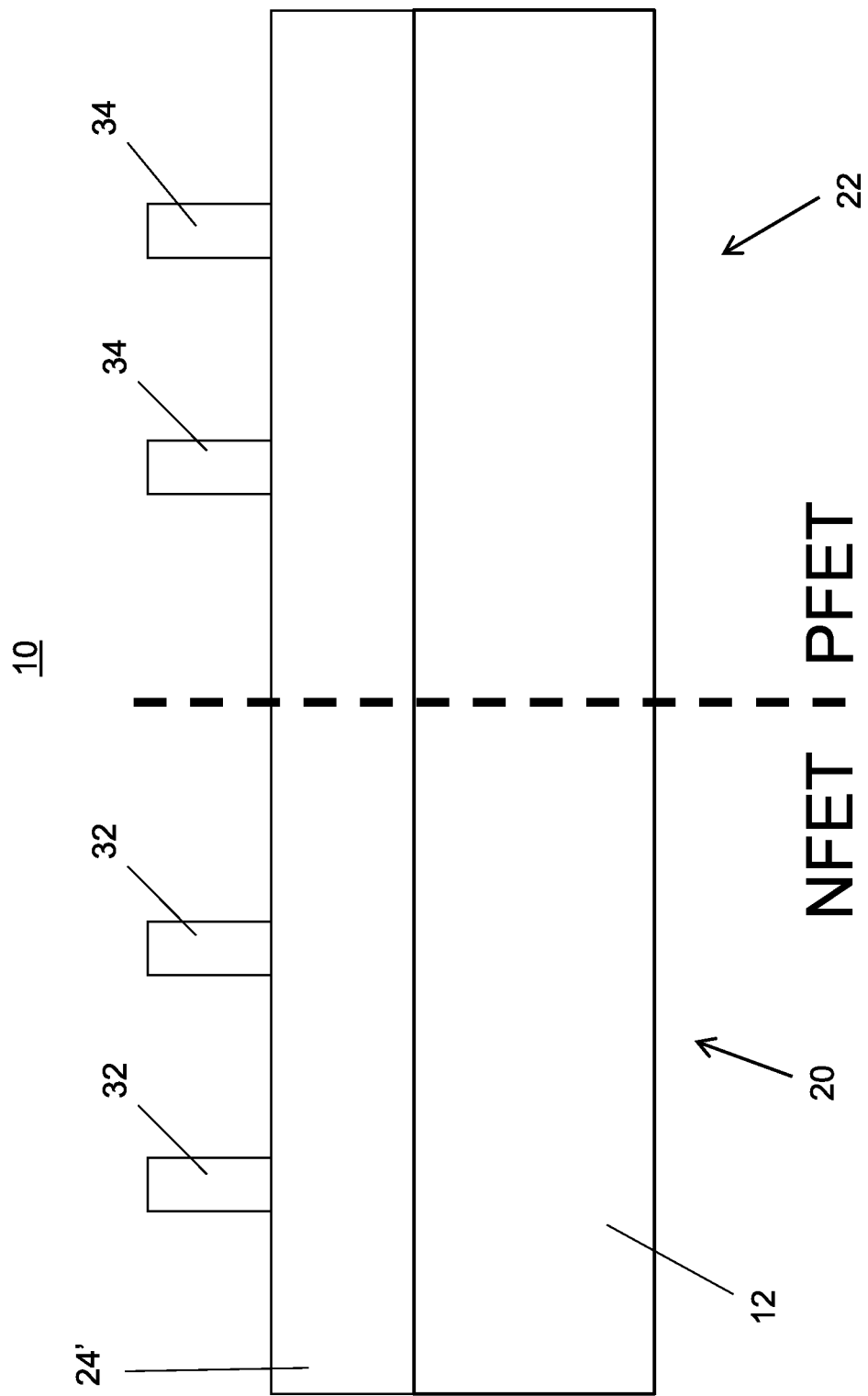
FIG. 8 is a cross-sectional view of the semiconductor device of FIG. 7 showing the second fins on the dielectric layer isolated from the substrate and ready for further processing in accordance with the present principles.

Referring to FIG. 8, the spacers 38 and hard mask 30 are removed selectively with respect to the fins 32 and 34. In one embodiment, the fins 32 include crystalline Si for use in NFET finFETs, and the fins 34 include crystalline SiGe for use in PFET finFETs. In accordance with the present principles, etching the fins 32, 34 after spacers are formed no longer results in erosion of the fin. The protective qualities of the spacer avoid this erosion. The fins 32, 34 are protected for a large portion of the process by sacrificial spacers 38 and hardmask 30. In addition, all fins 32, 34 are formed on a dielectric material and are sufficiently electrically isolated from the substrate 12. This helps to reduce current leakage. Since SiGe is not formed in the NFET region 20, Ge diffusion is confined to the PFET region 22. This helps to improve performance of both NFETs and PFETs. The structure of FIG. 8 is now ready for formation of finFETs. Processing continues with the formation of source and drain regions, gates, contacts, metallizations, etc.

In accordance with the present principles, the fins 32 and 34 are formed on a dielectric layer 24'. In addition, the source and drain regions associated with these fins 32, 34 will be formed on the dielectric layer 24' as well. The dielectric layer 24' functions as a shallow trench isolation region and reduces leakage from source, drain, channel, etc. to the substrate 12. In addition, bulk silicon processing may be employed which provides the same and additional advantages over use of semiconductor-on-insulator substrates.

Figure 9:
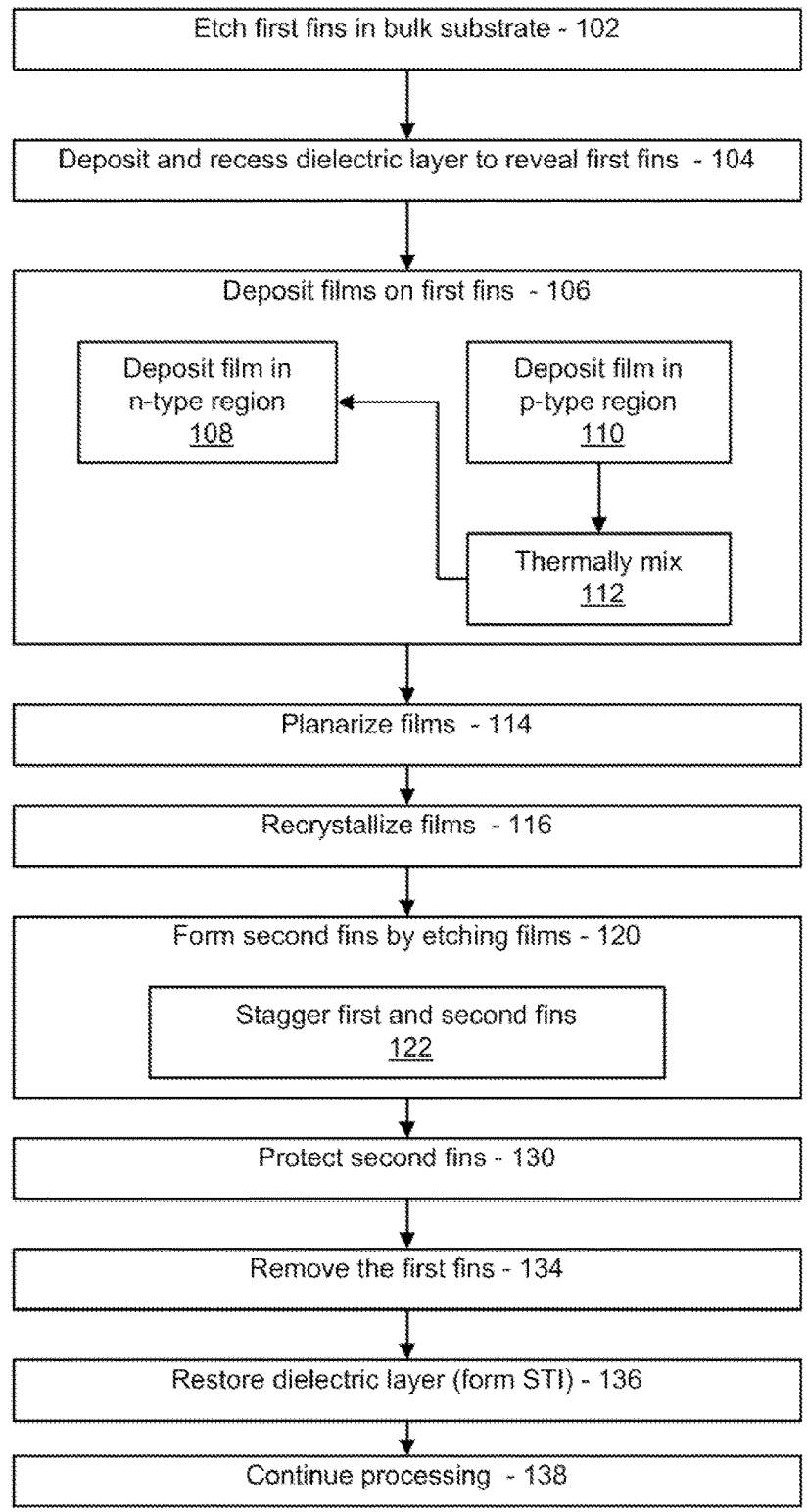
FIG. 9 is a block/flow diagram showing a method for forming a semiconductor device with fins formed on a dielectric material using a bulk substrate in accordance with illustrative embodiments.

Referring to FIG. 9, methods for forming a semiconductor device are illustratively described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, first fins are etched into a bulk semiconductor substrate. In one embodiment, the etching process is carried out in accordance with a lithographic mask. In another embodiment, the etching employs a SIT mask. The bulk substrate may include Si, although other substrate materials may be employed. In block 104, a first dielectric layer is deposited and recessed to reveal or expose a portion of the first fins through the dielectric layer formed over the first fins. The dielectric layer may include an oxide although other dielectric material may be employed.

In block 106, film deposition is performed. In block 108, a first film is deposited over the first fins in a region for n-type devices. The first film preferably includes Si. The first film may be deposited by epitaxial growth. In other embodiments, the first film may be deposited in an amorphous phase.

In block 110, a second film is deposited over the first fins in a region for p-type devices. The second film may be epitaxially grown. In other embodiments, the second film may be deposited in an amorphous phase. In block 112, the second film may include SiGe and be thermally mixed to ensure uniform distribution of Ge in the Si. In a preferred embodiment, the formation and thermal mixing of the SiGe film is performed prior to the formation of the Si film to avoid Ge laterally diffusing into the Si film.

In block 114, the first and second films are planarized, e.g., by a CMP process. In block 116, if the first film and/or the second film include an amorphous phase, the first film and/or the second film are recrystallized, e.g., by a solid phase epitaxial recrystallization process.

In block 120, the first film and the second film are etched to form second fins in both regions for n-type devices and for p-type devices. In block 122, the first film and the second film are patterned so that the second fins are formed over dielectric material of the first dielectric layer. This includes staggering positions between the first film and the second film to prevent vertical alignment.

In block 130, the second fins are protected to perform selective etching. Protecting the second fins may include encapsulating the second fins in a sacrificial dielectric material, e.g., using spacers and a hardmask top.

In block, 134, the first fins are removed from the first dielectric layer. This may include selectively etching the first fins. In another embodiment, an oxidation process may be performed to convert the fins to dielectric/STI. If the oxidation process is employed to convert the fins to dielectric/STI, then block 136 may be skipped.

In block 136, material of the first dielectric layer is restored to form an isolation layer separating the second fins from the substrate. Restoring material in the first dielectric layer may include depositing a dielectric material in trenches left by removing the first fins. In block 138, processing continues to form gate structures, S/D regions, contacts, metallizations, etc.

Having described preferred embodiments for fin isolation on a bulk wafer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims:

1. A method for forming a semiconductor device, comprising:
    etching first fins into a bulk semiconductor substrate;
    exposing a portion of the first fins through a first dielectric layer formed over the first fins;
    depositing a first film over the first fins in a region for n-type devices;
    depositing a second film over the first fins in a region for p-type devices;
    etching the first film and the second film to form second fins in the regions for n-type devices and for the region for p-type devices;
    protecting the second fins; and
    removing the first fins from the first dielectric layer to form an isolation layer separating the second fins from the substrate.

2. The method as recited in claim 1, wherein depositing the first film over the first fins in a region for n-type devices includes epitaxially growing the first film on the first fins.

3. The method as recited in claim 1, wherein depositing the second film over the first fins in a region for p-type devices includes:
    epitaxially growing materials for the second film on the first fins; and
    thermally mixing the materials to form the second film.

4. The method as recited in claim 1, wherein at least one of the first film and the second film includes an amorphous phase and further comprising: recrystallizing the at least one of the first film and the second film.

5. The method as recited in claim 1, wherein etching the first film and the second film includes patterning the first film and the second film such that the second fins are formed over dielectric material of the first dielectric layer.

6. The method as recited in claim 5, wherein the first fins and the second fins are staggered to prevent vertical alignment.

7. The method as recited in claim 1, wherein protecting the second fins includes encapsulating the second fins in a sacrificial dielectric material.

8. The method as recited in claim 1, wherein removing includes:
    etching the first fins; and
    depositing a dielectric material in trenches left by removing the first fins.

9. The method as recited in claim 1, wherein removing includes oxidizing the first fins.

10. A method for forming a semiconductor device, comprising:
    etching first fins into a bulk semiconductor substrate, the first fins including Si;
    exposing a portion of the first fins through a first dielectric layer formed over the first fins;
    depositing and thermally mixing a SiGe film over the first fins in a region for p-type devices;
    depositing a Si film over the first fins in a region for n-type devices after the thermal mixing to prevent Ge diffusion into the Si film;
    etching the Si film and the SiGe film to form second fins in the regions for n-type devices and p-type devices;
    protecting the second fins; and
    removing the first fins from the first dielectric layer to form an isolation layer separating the second fins from the substrate.

11. The method as recited in claim 10, wherein depositing the Si film over the first fins in a region for n-type devices includes epitaxially growing the Si film on the first fins using the first fins as a seed layer.

12. The method as recited in claim 10, wherein depositing the SiGe film over the first fins in a region for p-type devices includes epitaxially growing SiGe materials for the SiGe film on the first fins.

13. The method as recited in claim 10, wherein at least one of the Si film and the SiGe film includes an amorphous phase and further comprising: recrystallizing the at least one of the Si film and the SiGe film.

14. The method as recited in claim 10, wherein etching the Si film and the SiGe film includes patterning the Si film and the SiGe film such that the second fins are formed over dielectric material of the first dielectric layer.

15. The method as recited in claim 14, wherein the first fins and the second fins are staggered to prevent vertical alignment.

16. The method as recited in claim 10, wherein protecting the second fins include encapsulating the second fins in a sacrificial dielectric material.

17. The method as recited in claim 10, wherein removing includes:
    etching the first fins; and
    depositing a dielectric material in trenches left by removing the first fins.

18. A method for forming a semiconductor device, comprising:
    etching first fins into a bulk semiconductor substrate, the first fins including Si;
    exposing a portion of the first fins through a first dielectric layer formed over the first fins;
    depositing and thermally mixing a SiGe film over the first fins in a region for p-type devices;
    depositing a Si film over the first fins in a region for n-type devices after the thermal mixing to prevent Ge diffusion into the Si film;
    planarizing the Si and SiGe films;
    patterning the Si film and the SiGe film to form second fins in the regions for n-type and p-type devices wherein the second fins are formed over dielectric material of the first dielectric layer and are staggered from the first fins to prevent vertical alignment;
    protecting the second fins using a hardmask and spacers to encapsulate the second fins;
    removing the first fins from the first dielectric layer; and
    restoring material in the first dielectric layer to form an isolation layer separating the second fins from the substrate.

19. The method as recited in claim 18, wherein at least one of the Si film and the SiGe film includes an amorphous phase and further comprising: recrystallizing the at least one of the Si film and the SiGe film.

20. The method as recited in claim 18, wherein restoring material in the first dielectric layer includes depositing a dielectric material in trenches left by removing the first fins.

* * * * *